United States Patent
Rategh et al.

(10) Patent No.: US 6,803,824 B2
(45) Date of Patent: Oct. 12, 2004

(54) DYNAMIC MATCHING IN CASCODE CIRCUITS

(75) Inventors: Hamid Reza Rategh, Cupertino, CA (US); Payman Hosseinzadeh Shanjani, Sunnyvale, CA (US); Ngar Loong Alan Chan, Mountain View, CA (US); Mehdi Frederik Soltan, Stanford, CA (US)

(73) Assignee: Anadigics, Inc., Warren, NJ (US)

( * ) Notice: Subject to any disclaimer, the term of this patent is extended or adjusted under 35 U.S.C. 154(b) by 110 days.

(21) Appl. No.: 10/024,943

(22) Filed: Dec. 18, 2001

(65) Prior Publication Data

US 2003/0112078 A1 Jun. 19, 2003

(51) Int. Cl.[7] .................................................. H03F 3/04
(52) U.S. Cl. ........................ 330/302; 330/305; 330/311
(58) Field of Search .............................. 330/302, 305, 330/306, 311, 310, 285, 288, 289, 132, 136, 16, 17, 257, 133

(56) References Cited

U.S. PATENT DOCUMENTS

| 3,997,852 A | 12/1976 | Schornack et al. ............ 330/35 |
| 5,898,168 A | 4/1999 | Gowda et al. ............ 250/208.1 |
| 6,127,886 A | * 10/2000 | Khabbaz et al. .............. 330/51 |
| 6,163,215 A | 12/2000 | Shibata et al. .............. 330/254 |
| 6,172,549 B1 | * 1/2001 | Gilbert ....................... 327/349 |
| 6,292,060 B1 | 9/2001 | Yeo et al. .................... 330/302 |
| 6,304,145 B1 | * 10/2001 | Laureanti et al. ........... 330/285 |
| 6,313,705 B1 | * 11/2001 | Dening et al. .............. 330/276 |
| 6,417,734 B1 | * 7/2002 | Luo et al. .................... 330/296 |
| 6,492,872 B1 | * 12/2002 | Fujioka et al. .............. 330/285 |

* cited by examiner

Primary Examiner—Michael Tokar
Assistant Examiner—Linh Van Nguyen
(74) Attorney, Agent, or Firm—H. Black, P.E.

(57) ABSTRACT

A method and apparatus for a variable gain cascode amplifier (or attenuator) is disclosed. Embodiments provide for a compensated input impedance. A gain/impedance controller compensates input impedance corresponding to gain adjustments.

24 Claims, 3 Drawing Sheets

US 6,803,824 B2

DYNAMIC MATCHING IN CASCODE CIRCUITS

TECHNICAL FIELD OF THE INVENTION

The invention generally relates to electronics circuits. The invention more particularly relates to dynamic matching in cascode circuits, for example, cascode circuits that are used to provide adjustable gain of an input signal.

BACKGROUND

In analog electronic circuits, amplifiers are constructed in many configurations and have various parametric tradeoffs. Discrete dual gate MOSFET (metal-oxide semiconductor field-effect transistor) based amplifiers have been used as IF (intermediate frequency) amplifiers with adjustable gain. In such amplifiers the two gates of the dual gate MOSFET may be arranged as a common source device (transistor) feeding a common gate device—i.e., as a cascode. The common source transistor receives the input signal and the combination of the common gate and common source transistors control the gain and provide isolation. Such amplifiers have good dynamic range, noise figure and reverse isolation. However, they may suffer from distortion at low gain settings and their input impedance may vary with gain.

There is a need to provide amplifiers having controllable gain, good dynamic range, noise figure and reverse isolation but also suitable for higher operating frequencies (microwave rather than IF) and having excellent input match at both high and low gain settings.

SUMMARY OF THE INVENTION

Accordingly, the invention provides amplifiers with superior performance and input matching. Such an amplifier may be implemented as an IC (integrated circuit) with CMOS (complementary metal-oxide semiconductor) or other semiconductor technologies such as GaAs (Gallium Arsenide). High operating frequency (e.g., microwave) may be supported through LSI (large scale integration), as is well-known in the art. Superior performance results from aspects of the novel designs.

According to a first aspect of the invention, a method for improving an input match in a circuit is presented. The method may comprise: operating a cascode having a stage gain controlled by a level setting gain control voltage and operating an impedance compensating circuit. The impedance compensating circuit may controlled by the same level setting gain control voltage.

According to a further aspect of the invention, a circuit for processing a signal comprising is presented. The circuit may include a cascode, a gain controller controlling a gain of the cascode; and an impedance controller loading an input impedance of the cascode with a loading impedance responsive to the control signal. The circuit may operate with adjustable gain and compensated impedance.

DESCRIPTION OF DRAWINGS

For simplicity in description, identical components are labeled by identical numerals throughout this document.

DETAILED DESCRIPTION

Figure 1:
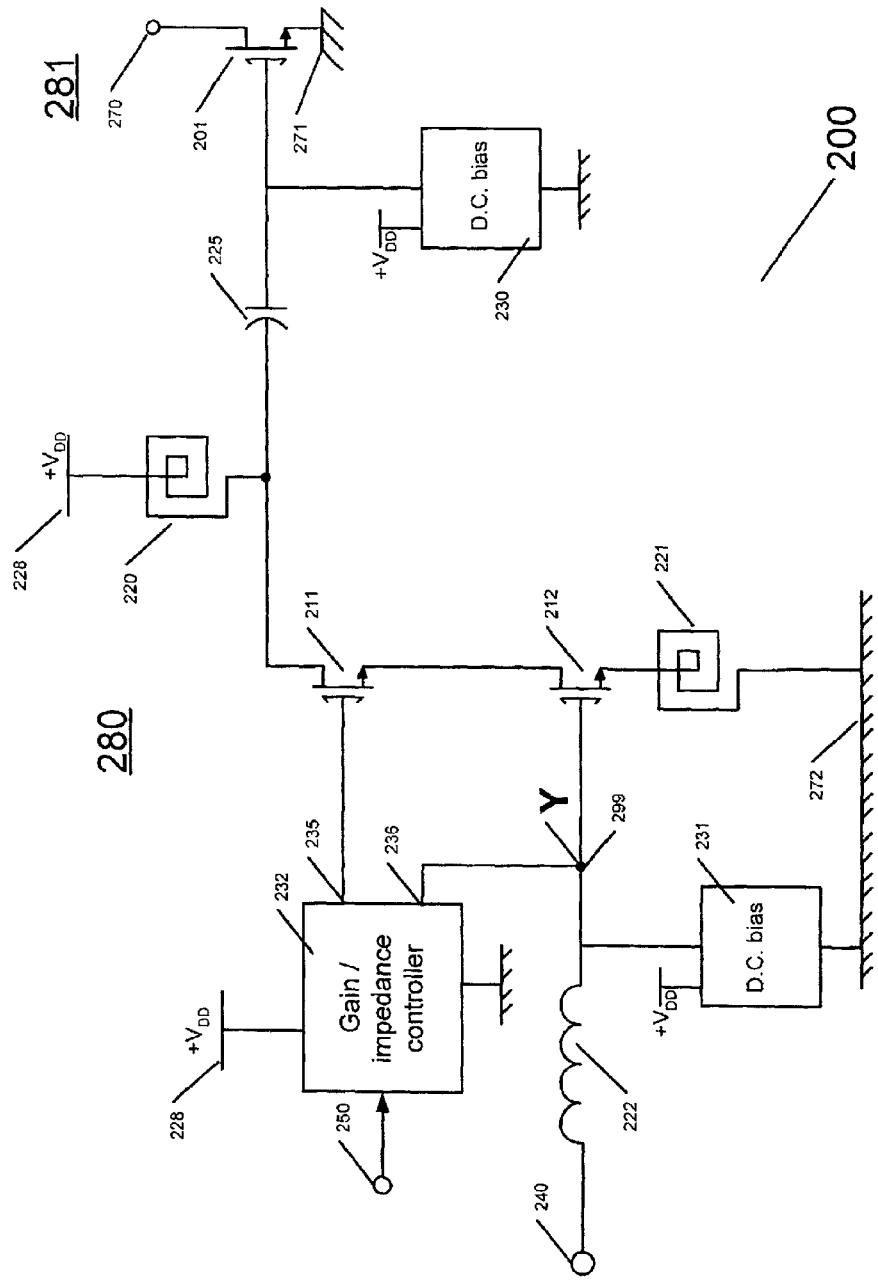
FIG. 1 shows a schematic diagram, in partial block form, of a circuit according to an embodiment of the invention.

In the following description, for purposes of clarity and conciseness of the description, not all of the numerous components shown in the schematic are described. The numerous components are shown in the drawings to provide a person of ordinary skill in the art a thorough, enabling disclosure of the present invention. The operation of many of the components would be understood and apparent to one skilled in the art.

FIG. 1 shows a schematic diagram, in partial block form, of a circuit according to an embodiment of the invention. Circuit 200 may be implemented partially or wholly on one or more integrated circuits (ICs). As shown, circuit 200 implements an analog RFIC (radio frequency integrated circuit) PA (power amplifier). As such, circuit 200 may produce relatively high power levels, such as might typically be needed in connection with a transmitter driving a radiating antenna. Circuit 200 comprises an output stage 281 and a driver stage 280 and can be implemented as part of a semiconductor chip using well known technologies such as MOS (metal-oxide semiconductors). NMOS transistors (n-channel MOS transistors) are shown in the circuit 200 but their use is exemplary only and comparable circuits may be constructed using p-channel devices, BJTs (bipolar junction transistors) or other active solid state devices within the general scope of the invention.

In circuit 200, NMOS transistor 201 may function as an output stage amplifier. Transistor 201 operates between output port 270 and output ground 271. Output port 270 may provide load (not shown) and bias current and may also connect via a matching network (not shown) to match load impedance to output impedance. DC (direct current) bias circuit 230 provides offset bias for the gate of transistor 201. In an embodiment of the invention, transistor 201 may operate as an amplifier in the triode region. Coupling capacitor 225 couples a RF signal into the output stage 281. Capacitor 225 may be embodied as an on-chip capacitor (implemented, for example, by well-known MOS processes). Only a small capacitor may be required. For example, at 2 GHz (gigahertz), a 1 pF (picofarad) capacitor has an admittance of approximately $-j10$ S (i.e., 10 siemens, leading).

Transistor 211 operates in common gate mode. In other embodiments using BJTs, transistor 211 can operate in common base mode. The gain/impedance controller 232 generates a bias voltage at port 235 for the gate of transistor 211. Inductor 220 connects a DC power supply ($V_{DD}$) rail 228 to the drain of transistor 211. Inductive load 220 acts with capacitor 225 and inductor 221 to provide inter-stage matching for a RF signal. Inductors 220 and 221 may be implemented as on-chip spiral conductor techniques well known in the art or by other techniques. Spiral inductors may have a relatively low Q factor when resonated.

Transistor 212 may operate in common source mode and is grounded via inductor 221. In other embodiments, transistor 212 may operate in common drain mode, or if BJTs are used, transistor 212 can operate in common emitter or common collector modes. Transistor 212 is biased by DC bias circuit 231. Thus, transistors 211 and 212 form a cascode. The cascode arrangement provides good isolation, thus preventing signal from back feeding from output port 270 into signal input port 240 through inductor 222. Moreover, the Miller capacitance effect looking into the gate of transistor 212 is largely eliminated by the cascode. Input port 240 receives a low power signal.

Output stage 281 may be configured as a single transistor amplifier because, as the final stage, it must carry large power levels. In contrast, driver stage 280 operates at significantly more moderate power levels, but still at a much greater power level than the signal at the input port 240. The use of a cascode in driver stage 280 thus offers good gain, noise performance, and excellent reverse isolation. Cascodes also substantially eliminate problems associated with the Miller effect. Good isolation is achieved in that common gate transistor 211 presents a very low impedance ($1/g_M$, the inverse of the transconductance) looking into its source terminal. Thus, common source transistor 212 drives into a very low impedance resulting in sub-unity voltage gain and relatively large current gain. In turn, transistor 211 (which may operate in common gate mode) passes the same current but provides a voltage gain, and hence, a power gain. The gain/impedance controller input port 250 receives a DC voltage level to direct the gain of the driver stage 280 and the impedance compensation. The gain/impedance controller 232 generates a level setting gain control voltage which appears at output port 235. The gain/impedance controller 232 may control the overall gain of the driver stage 280 by adjusting the gate bias of transistor 211. However, as the gain changes the input load presented at the gate of transistor 212 at node Y 299 also changes. The gain/impedance controller 232 operates to change the load impedance at its second output port 236, thus preventing a changing match at input port 240. This generally keeps the impedance presented at node Y 299 constant. Thus, problems of input impedance varying with gain are largely overcome by the compensating action of gain/impedance controller 232.

It is important in RFICs that impedance be carefully matched at each stage since impedance discontinuities may cause reflections, and reflections may in turn collide to cause voltage spikes and/or spurs which may result in various undesirable effects such as poor reliability, poor stability and/or unpredictable behavior.

Figure 2:
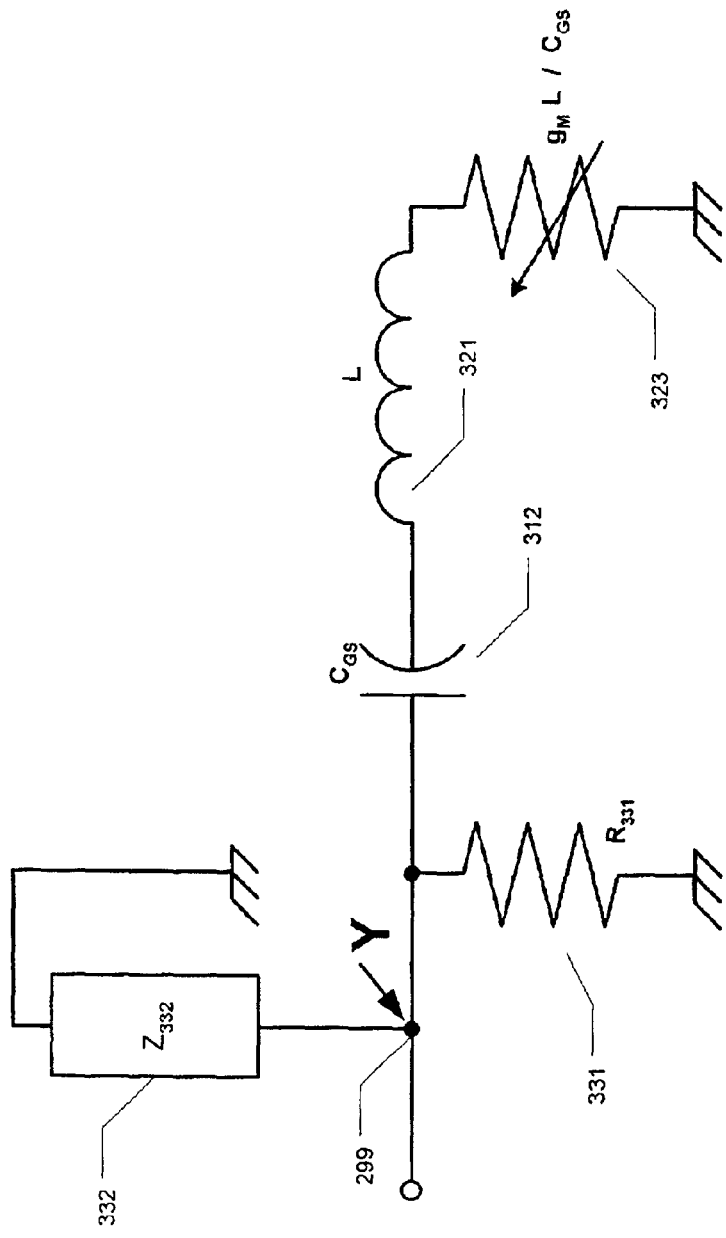
FIG. 2 shows a small signal equivalent circuit for an input impedance seen at an input port of a circuit according to an embodiment of the invention.

FIG. 2 shows a small signal equivalent circuit for an input impedance seen at an input port of a circuit according to an embodiment of the invention. The input impedance may be seen at node Y 299 (FIGS. 1 and 2). Referring to both FIG. 1 and FIG. 2, the resistance 331 represents the small signal resistive load $R_{331}$ of the DC bias circuit 231. The gate to source capacitance $C_{GS}$ of transistor 212 is represented as capacitance 312 having reactance of $1/(j\ C_{GS}\ \omega_0)$ where $2\pi\omega_0$ is the center operating frequency of the RF circuit which is taken to be narrow banded for the purposes of explanation. Source follower inductive load 321 due to inductor 221 appears as a reactance of $j\omega_0 L$ where L is the self-inductance of inductor 221. Resistance 323 represents the real part of source follower inductive load due to inductor 221 and takes the value $\omega_T L$ where $\omega_T$ is the angular frequency where the current gain of transistor 212 is unity and, as before L is the self-inductance of inductor 221. Thus, $\omega_T$ is numerically equal to $g_M/C_{GS}$, where $g_M$ is the transconductance of transistor 212 and $C_{GS}$ is the gate to source capacitance of the same transistor.

Resistance 323 is shown as a variable resistance in FIG. 2 because it varies as the gain of driver stage 280 varies. Resistance 323 varies as $g_M$ varies and $g_M$ varies as the drain to source voltage $V_{DS}$ varies, which happens as a result of changing the gate control voltage of transistor 211 (the cascode transistor). Thus, the input impedance $Z_{in}$ at node Y299 may be expressed by a formula herein referred to as formula (1):

$$Z_{in}=Z_{332}//R_{331}//(1/(jC_{GS}\omega_0)+j\omega_0 L+g_M L/C_{GS})$$

Where $Z_{332}$ is the impedance 332 presented by gain/impedance controller 232. Thus, $Z_{in}$ is held substantially constant even as $g_M$ varies. This result is achieved by automatic compensation in the value of $Z_{332}$ by the action of gain/impedance controller 232. Gain/impedance controller 232 regulates both the gate control voltage of transistor 211 and the impedance load 332 upon node Y299 in unison in order to maintain an invariant small signal input impedance at node Y299. Improving an input match has many advantages as is well known in the art.

Figure 3:
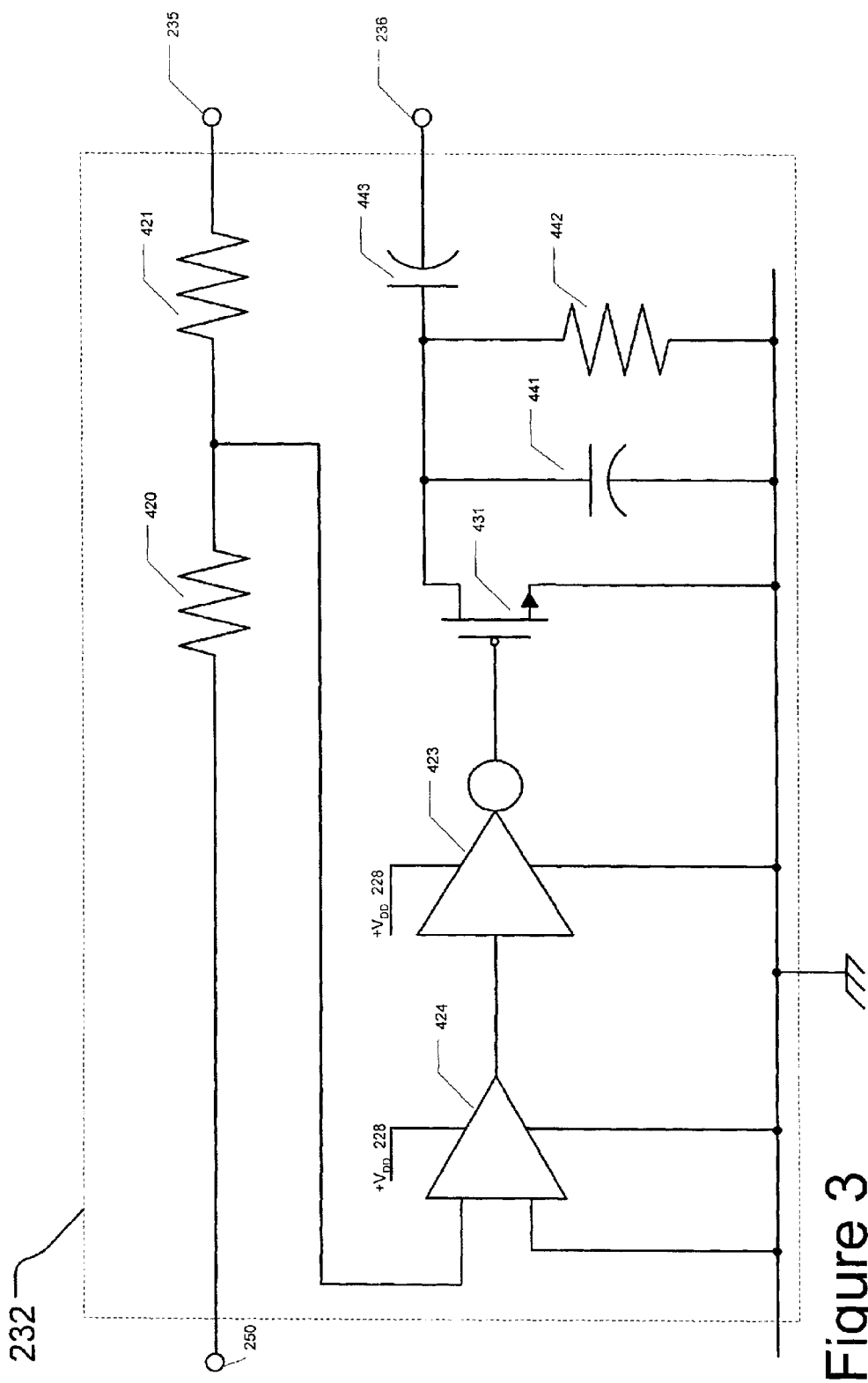
FIG. 3 is a schematic diagram, in partial block form, of a circuit for a gain and impedance controller according to an embodiment of the invention.

FIG. 3 is a schematic diagram, in partial block form, of a circuit for a gain/impedance controller 232 according to an embodiment of the invention.

Gain/impedance controller input port 250 receives a DC voltage level to direct the gain of the driver stage and to direct impedance compensation. Output port 235 provides a bias voltage to control the gain of the cascode (external to gain/impedance controller 232). Transistor 431 presents a variable resistance load which varies according to voltage supplied at controller input port 250. Voltage supplied at controller input port 250 is processed by resistors 420, 421, operational amplifier 424 and inverter 423 to form gate control voltage for transistor 431. Capacitor 441 and resistor 442 provide invariant loads and capacitor 443 also forms part of the load in series with transistor 431. Thus, the load at output port 236 varies with voltage input at port 250. This varying load compensates for the varying impedance at the gate of the common source configured transistor 212 in FIG. 1. In gain/impedance controller 232, as the voltage supplied at the controller input 250 goes down, the drain-source resistance of transistor 431 also goes down. A reduced input also biases transistor 211 (FIG. 1) for reduced gain in the cascode as a whole and hence a reduced $g_M$ value for transistor 212 (FIG. 1). A reduced $g_M$ will correspond to a lower resistance in series with capacitance in the small signal equivalent circuit input at the gate of transistor 211 (FIG. 1), which is equivalently an increased parallel resistance at the particular frequency of narrow band operation. Accordingly, a reduced impedance presented by gain/impedance controller 232 compensates in the desired direction.

Component values for optimal quantitative compensation may be determined by circuit simulation techniques which are well known in the art. In one embodiment, initial values may be calculated for capacitor 443, resistor 442, capacitor 441 and transistor 431 such that $Z_{332}$ (FIG. 2) takes values so that $Z_{in}$ remains constant in formula (1) as $g_M$, and hence gain, vary in unison. This allows the voltage/current characteristics of transistor 431 to be aligned to produce the desired impedance compensation. Various suitable circuit simulation software packages are commonplace in the art; for example, HSPICE™ may be used.

Embodiments of the invention as described herein have significant advantages over previously developed implementations. For example, previously developed embodiments of variable gain cascode amplifier have been constructed that have unwanted variation in signal input impedance.

As will be apparent to one of ordinary skill in the art, other similar circuit arrangements are possible within the general scope of the invention. For example p-channel devices and n-channel devices may be interchanged with appropriate source-drain and polarity transpositions as is well known in the art. Further examples may include cascodes with compensation input impedance circuits embodied using discrete transistors or as integrated circuits, using metal-oxide semiconductors or other field effect transistors, and/or with Gallium Arsenide transistors or other technologies. Bipolar junction transistors or thermionic tubes could also be used to construct an embodiment of the invention using the appropriate cascode arrangements. As another example, the gain/impedance controller circuit could be replaced by separate gain and impedance controller circuits that are both responsive to a common input control signal. As a still further example, compensating impedances could be connected in series or in some combination of series-parallel rather than solely in parallel as described in the exemplary embodiment. Also it is possible to replace analog circuits with digital functional equivalents within the general scope of the invention. The embodiments described above are exemplary rather than limiting and the bounds of the invention should be determined from the claims.

What is claimed is:

1. A method for improving an input match in a circuit comprising:

operating a cascode having an input signal port with an input signal impedance and further having a stage gain controlled by a level setting gain control voltage; and operating an impedance compensating circuit for changing a compensating impedance presented at the input signal port, wherein the impedance compensating circuit is controlled by the level setting gain control voltage and wherein the impedance compensating circuit is operable to counteract changes in the input signal impedance correlated with changes in the stage gain.

2. The method of claim 1 wherein:
the impedance compensating circuit is connected in parallel with the input signal port.

3. The method of claim 1 wherein:
the impedance compensating circuit is connected in series with the input signal port.

4. The method of claim 1 wherein:
the impedance compensating circuit is connected in series-parallel with the input signal port.

5. The method of claim 1 wherein:
the cascode is implemented using Gallium Arsenide transistors.

6. The method of claim 1 wherein:
the cascode is implemented using metal-oxide semiconductor transistors formed as an integrated circuit.

7. The method of claim 1 wherein:
the cascode is implemented using devices selected from a list consisting of metal-oxide semiconductor transistors, silicon bipolar transistors and germanium transistors.

8. The method of claim 1 wherein
the stage gain is adjustable responsive to changes in the level setting gain control voltage.

9. The method of claim 4 wherein:
the impedance compensating circuit is connected in parallel with the input signal port.

10. The method of claim 8 wherein:
the impedance compensating circuit is connected in series with the input signal port.

11. The method of claim 8 wherein:
the impedance compensating circuit is connected in series-parallel with the input signal port.

12. A circuit for processing a signal comprising:
a cascode having
a first transistor connected in a configuration selected from a group consisting of a common gate configuration and a common base configuration and
a second transistor connected in a configuration selected from a group consisting of a common source configuration, a common drain configuration, a common emitter configuration and a common collector configuration;
a gain controller operable to adjust a gain of the cascode in response to a control signal; and
an impedance controller operable to adjust an input impedance of the cascode with a loading impedance in response to the control signal,
whereby the circuit operates with input impedance compensation.

13. The circuit of claim 12 wherein
the circuit is an amplifier.

14. The circuit of claim 12 wherein
the circuit is an amplifier that operates at a narrow band of frequencies in the microwave region.

15. The circuit of claim 12 wherein
the circuit is implemented as a single integrated circuit.

16. The circuit of claim 12 wherein
the circuit is implemented using metal-oxide semiconductor technologies.

17. The circuit of claim 12 wherein
the circuit is implemented using Gallium Arsenide technologies.

18. The circuit of claim 12 wherein
the impedance controller comprises an inverter.

19. The circuit of claim 12 wherein
the gain controller outputs a DC bias voltage that is applied to a control terminal of the first transistor.

20. A circuit for processing a signal comprising:
a cascode having
a first transistor connected in a configuration selected from a group consisting of a common gate configuration and a common base configuration and
a second transistor connected in a configuration selected from a group consisting of a common source configuration, a common drain configuration, a common emitter configuration and a common collector configuration;
a controller operable to adjust a gain of the cascode in response to a control signal and further operable to adjust an input impedance of the cascode with a loading impedance in response to the control signal;
whereby the circuit operates with input impedance compensation.

21. The circuit of claim 20 wherein
the circuit is an amplifier that operates at a narrow band of frequencies in the microwave region.

22. The circuit of claim 20 wherein
the circuit is implemented as a single integrated circuit.

23. The circuit of claim 20 wherein
the circuit is implemented using metal-oxide semiconductor technologies.

24. The circuit of claim 20 wherein
the circuit is implemented using Gallium Arsenide technologies.

* * * * *